United States Patent
Tabalujan et al.

(10) Patent No.: US 10,823,780 B1
(45) Date of Patent: Nov. 3, 2020

(54) TESTING AN INTEGRATED CIRCUIT RECEIVER IN A PACKAGE USING A VARYING ANALOG VOLTAGE

(71) Applicant: Xilinx, Inc., San Jose, CA (US)

(72) Inventors: Andrew Tabalujan, Milpitas, CA (US); Xiaobao Wang, Cupertino, CA (US); Gubo Huang, Milpitas, CA (US)

(73) Assignee: XILINX, INC., San Jose, CA (US)

( * ) Notice: Subject to any disclaimer, the term of this patent is extended or adjusted under 35 U.S.C. 154(b) by 166 days.

(21) Appl. No.: 16/112,433

(22) Filed: Aug. 24, 2018

(51) Int. Cl.
*G01R 31/28* (2006.01)
*G01R 19/257* (2006.01)
*H04B 17/20* (2015.01)
*H01L 25/065* (2006.01)

(52) U.S. Cl.
CPC ....... *G01R 31/2896* (2013.01); *G01R 19/257* (2013.01); *G01R 31/2856* (2013.01); *H04B 17/20* (2015.01); *H01L 25/0657* (2013.01)

(58) Field of Classification Search
CPC ......... H04L 25/03019; H04L 25/03828; H04L 5/0041; H04L 27/3863; H04L 1/001; H04L 27/0008; H04L 27/2647; H04L 43/50; G01D 5/35316; G01D 18/00; G01D 5/35383; H01L 23/481; H01L 25/00; H01L 2924/19107; H01L 25/0657; G01R 31/50; G01R 31/318555; G01R 31/2896; G01R 31/2856; G01R 19/527; G01R 23/02; G01R 27/00; G01R 31/2894; H01S 3/0092; H04B 17/20; H03K 3/03; H03K 3/0315; G06F 19/00; G06F 1/04; G06F 17/18; H03B 28/00
See application file for complete search history.

(56) References Cited

U.S. PATENT DOCUMENTS

| | | | | |
|---|---|---|---|---|
| 8,031,017 B2 * | 10/2011 | Mosalikanti | ....... | G01R 31/2894 331/108 D |
| 8,502,612 B2 * | 8/2013 | Mosalikanti | ....... | G01R 31/2894 331/108 D |
| 2007/0129031 A1 * | 6/2007 | Newton | ................. | H04B 17/14 455/127.2 |

* cited by examiner

*Primary Examiner* — Vinh P Nguyen
(74) *Attorney, Agent, or Firm* — Patterson + Sheridan, LLP

(57) ABSTRACT

Examples herein describe techniques for testing a receiver interface on a die. In one embodiment, the die includes tester circuitry which includes a digital to analog convertor (DAC) which outputs an analog test signal to a selector circuit (e.g., a multiplexer) which forwards the analog test signal to a receiver. By varying the analog test signal, the tester circuitry can identify one or more trip points corresponding to the receiver. That is, by monitoring the output of the receiver, a testing application can determine when the output of the receiver switches states thereby indicating that the analog test signal at the input of the receiver corresponds to the trip point of the receiver. In this manner, internal circuitry (e.g., the tester circuitry) can be used to test a receiver interface that may otherwise be inaccessible.

20 Claims, 6 Drawing Sheets

TESTING AN INTEGRATED CIRCUIT RECEIVER IN A PACKAGE USING A VARYING ANALOG VOLTAGE

TECHNICAL FIELD

Examples of the present disclosure generally relate to testing receiver interfaces between dies.

BACKGROUND

Many systems in package (SiP) include at least two dies that are interconnected either directly or using an interposer. In some situations, the communication interfaces between the devices are inaccessible to an external computing system. Put differently, a user or external application cannot access the communication interfaces between the dies. As such, the two dies can communicate on the interface without needing instructions or input from the user or external application.

While these die-to-die communication interfaces can permit high-speed communication, they are difficult to test. For example, once the dies are assembled into the SiP, the interfaces are inaccessible when means testing the receivers and/or transmitters may be difficult or impossible.

SUMMARY

Techniques for testing a receiver in a semiconductor die are described. One example is a method that includes selecting an analog voltage using a digital control signal transmitted to a digital to analog converter (DAC) in the semiconductor die and transmitting the analog voltage from the DAC to a multiplexer where the multiplexer forwards the analog voltage to the receiver. The method includes varying the analog voltage outputted by the DAC until an output of the receiver changes states and recording a trip voltage of the receiver, wherein the trip voltage corresponds to the analog voltage outputted by the DAC when the receiver changes states.

One example described herein is a semiconductor die that includes a multiplexer where a first input of the multiplexer is coupled to a receiver interface, a DAC connected to a second input of the multiplexer, and a receiver coupled to an output of the multiplexer. The semiconductor die is configured to determine a trip point of the receiver by selecting an analog voltage to output using the DAC, transmitting the analog voltage from the DAC to the multiplexer where the multiplexer forwards the analog voltage to the receiver, and varying the analog voltage outputted by the DAC until an output of the receiver changes states.

One example described herein is a system that includes a semiconductor die and a testing application communicatively coupled to the semiconductor die. The semiconductor die includes a multiplexer coupled to a receiver interface, a DAC connected to the multiplexer, and a receiver coupled to the multiplexer. The testing application is configured to transmit a digital control signal that controls an analog voltage outputted using the DAC, monitor an output of the receiver to determine when the receiver changes states, and record a trip voltage of the receiver where the trip voltage corresponds to the analog voltage outputted by the DAC when the receiver changes states.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
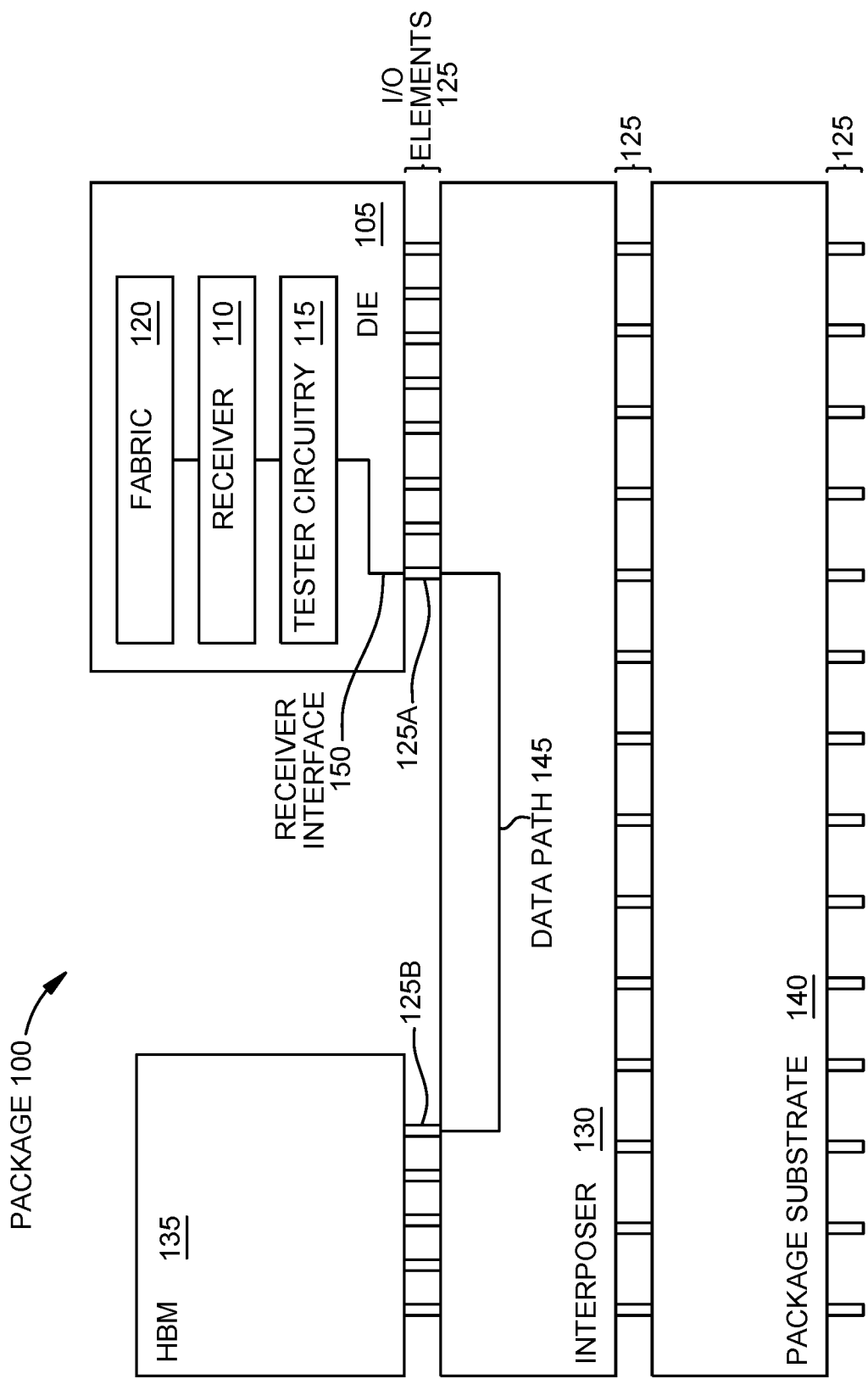
FIG. 1 is a block diagram of a package that includes tester circuitry for testing a die-to-die interface, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples herein describe techniques for testing a receiver interface on a semiconductor die. As mentioned above, the receiver interface may be inaccessible to general I/O elements (e.g., solder bumps, wire bond pads, I/O pins, etc.) which can make testing the receiver at the interface difficult. In one embodiment, the die includes tester circuitry for testing the receiver. To do so, the tester circuitry includes a digital to analog convertor (DAC) which outputs an analog test signal to a selector circuit (e.g., a multiplexer) which forwards the analog test signal to a receiver. By varying the analog test signal, the tester circuitry can identify one or more trip points corresponding to the receiver. That is, by monitoring the output of the receiver, a testing application can determine when the output of the receiver switches states thereby indicating that the analog test signal at the input of the receiver corresponds to the trip point of the receiver. In this manner, internal circuitry (e.g., the tester circuitry) can be used to test a receiver interface that may otherwise be inaccessible.

FIG. 1 is a block diagram of a package that includes tester circuitry for testing a die-to-die interface, according to an example. In one embodiment, the package 100 is a system in package (SiP) but is not limited to such. As shown, the package 100 includes a semiconductor die 105 (e.g., a semiconductor chip or integrated circuit) and a high bandwidth memory (HBM) 135 (e.g., a semiconductor memory die that includes DRAM) mounted on an interposer 130. The interposer 130 provides high-speed communication between the HBM 135 and the die 105. In one embodiment, the HBM 135 is a high-performance RAM interface which stores data generated by the die 105. The HBM 135 can be connected to a variety of different types of dies 105 such as a central processing unit (CPU), graphics processing unit (GPU), or field programmable gate array (FPGA).

In one embodiment, the HBM 135 can communicate only with the die 105. That is, while the die 105 may be able to communicate with other devices using the interposer 130 (e.g., other dies on the interposer 130 or an external computing system coupled to lower side of the interposer 130), the HBM 135 may be communicatively coupled to only the die 105 and the interposer 130. Further, the I/O interfaces in the HBM 135 and the die 105 used to communicate with each other may be inaccessible to other devices (or to the user operating the package 100). For example, the die 105 includes a receiver 110 for receiving data transmitted by the HBM 135 to the die 105 via the interposer 130. To do so, one or more of the I/O elements 125 (e.g., solder bumps or I/O pins) that communicatively couple the die 105 to the interposer 130 (e.g., the I/O element 125A) are assigned to the receiver 110 which the receiver 110 uses to receive data from the HBM 135. The interposer 130 (e.g., a semiconductor substrate) includes one or more data paths 145 (e.g., wire traces, vias, etc.) which couple the I/O element 125A assigned to the receiver 110 to a corresponding I/O element 125B on the HBM 135. The I/O elements 125A and 125B and the data path 145 can be referred to as a die-to-die communication interface between the HBM 135 and the die 105. The user (or other device) may be unable to access the communication interface between the die 105 and the HBM 135. Thus, to the perspective of the user, the HBM 135 and the die 105 can appear as being an integrated system rather than two separate substrates or devices as shown in FIG. 1.

The die 105 includes tester circuitry 115 which is coupled to the receiver 110. In one embodiment, the die 105 uses the tester circuitry 115 to test the trip point (or trip points) of the receiver 110. The trip point indicates a voltage where the output state of the receiver flips—e.g., from high-to-low or from low-to-high. That is, as the voltage at the input of the receiver 110 (e.g., the receiver interface 150) goes from high to low, there is a trip point $V_L$ where the output of the receiver 110 switches from a high output to a low output. Similarly, when the input of the receiver 110 goes from low to high, there is a trip point $V_H$ where the output of the receiver 110 switches from the low output to a high output. The $V_H$ and $V_L$ trip points may be the same voltage or slightly different voltages.

Due to variations in fabrication, the trip point or points of the receiver 110 may be unknown. As such, the user may want to identify the trip point of the receiver 110 when testing the die 105. Because the tester circuitry 115 is coupled to the receiver interface 150, the tester circuitry 115 can apply test voltages at the receiver 110 to identify the trip point of the receiver 110. That is, even after the die 105 has been assembled to form the package 100, the tester circuitry 115 can access the receiver interface 150 (which may be inaccessible to an external computing system) in order to test the receiver 110.

The output of the receiver 110 is coupled to a fabric 120. The fabric 120 may be a network which permits the output of the receiver 110 to be read by an external computing system. That is, while the receiver interface 150 may be inaccessible, the output of the receiver 110 can be read by an external computing system (e.g., a testing application) coupled to the package 100. For example, the fabric 120 may be communicatively coupled to one of the I/O elements 125 which are accessible to the external computing system. In this manner, a testing application (e.g., a software application or test probe system) can monitor the output of the receiver 110 as the tester circuitry 115 varies the input of the receiver 110.

The interposer 130 includes I/O elements 125 on the side opposite the side connecting to the HBM 135 and the die 105 which couples the interposer 130 to a package substrate 140. These I/O elements 125 permit the die 105 to communicate with an external computing system that is coupled to the package substrate 140. Put differently, the interposer 130 permits the die 105 to communicate with both the HBM 135 and the package substrate 140. In turn, the package substrate 140 can include I/O elements 125 which couple the package 100 to an external computing system which can execute a user application (during normal operation) and a testing application (when testing the die 105).

Figure 2:
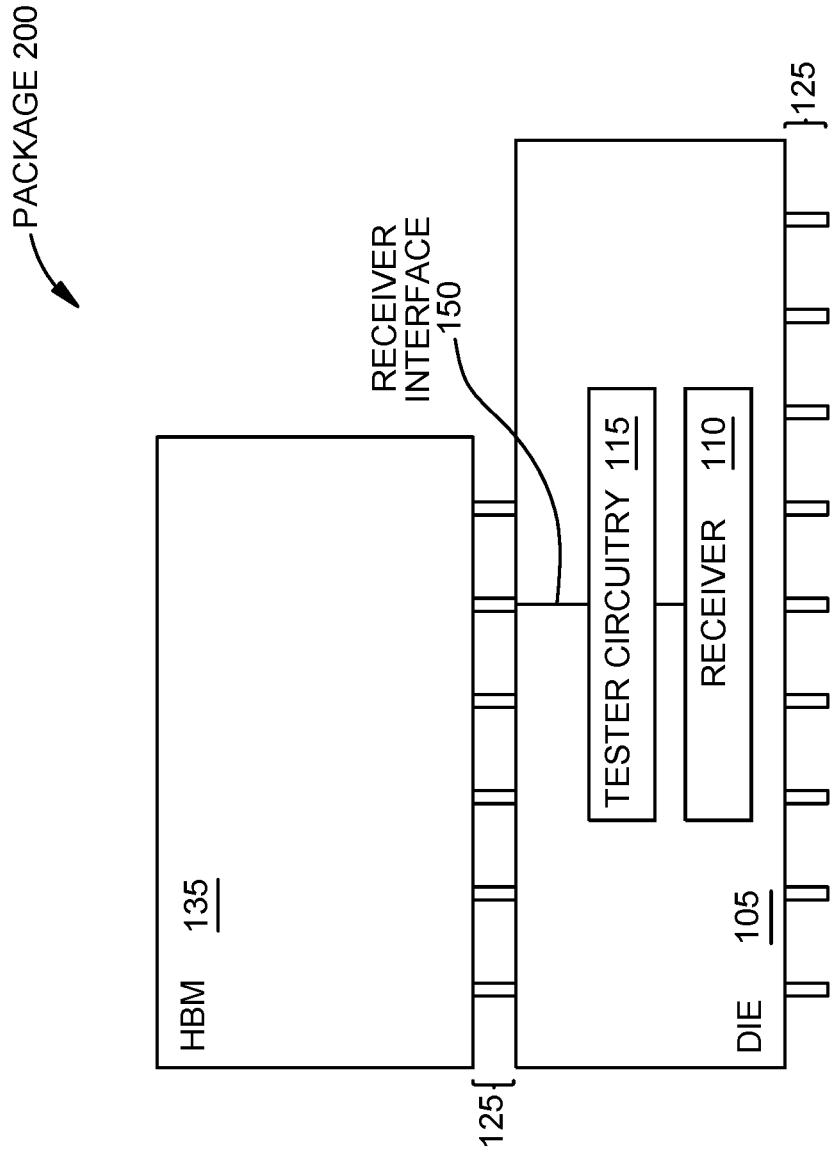
FIG. 2 is a block diagram of a package that includes tester circuitry for testing a die-to-die interface, according to an example.

However, FIG. 1 is just one example of a package 100 in which a die 105 with tester circuitry 115 can be used. For example, rather than a 2.5D arrangement as shown, one or more HBMs 135 (and other dies or devices) can be stacked on or under the die 105 to form a 3D stack. FIG. 2 is a block diagram of a package 200 that includes tester circuitry 115 for testing a die-to-die interface in a 3D stack, according to an example. As shown, the HBM 135 is stacked on the die 105 which are communicatively coupled to each other using the I/O elements 125. In this arrangement, the interposer can be omitted since the HBM 135 is directly connected to the die 105 by the I/O elements 125.

In one embodiment, devices in the stack use the I/O elements 125 (e.g., solder bumps) and through vias to communicate. One of the I/O elements 125 is coupled to the receiver interface 150 which permits the receiver 110 to receive data transmitted by the HBM 135. Moreover, the die 105 includes the tester circuitry 115 coupled to the receiver interface 150 so that the interface 150 can be tested after the package 200 has been assembled.

Although the package 200 illustrates two dies, the package 200 can include any number of dies. For example, another HBM may be stacked on the HBM 135 and use through vias to enable both HBMs to communicate with receivers 110 in the die 105. Further, other dies or substrates can be attached to the bottom of the die 105 such as a package substrate.

Figure 3:
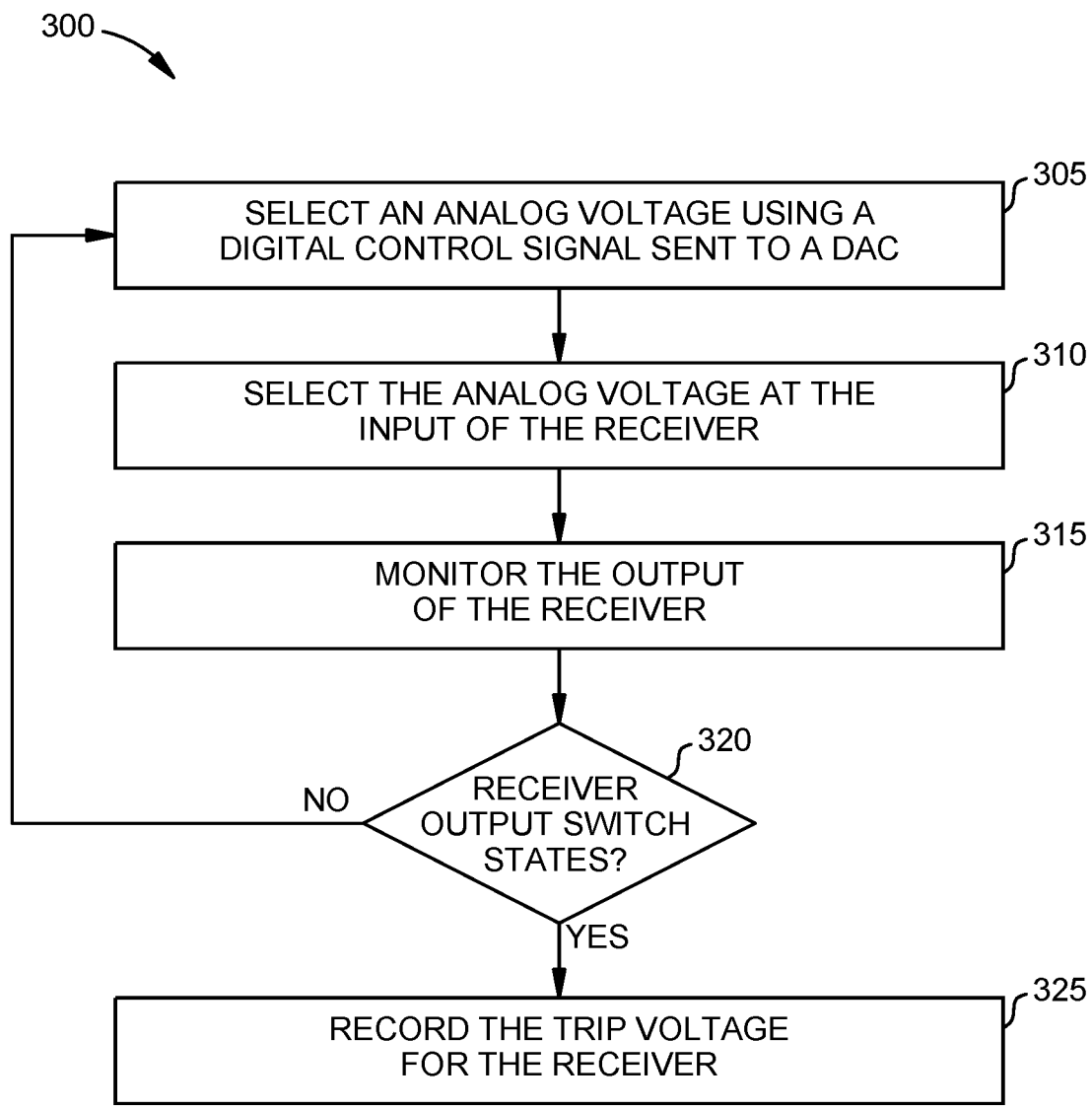
FIG. 3 is a flowchart for testing a die-to-die interface, according to an example.
Figure 4:
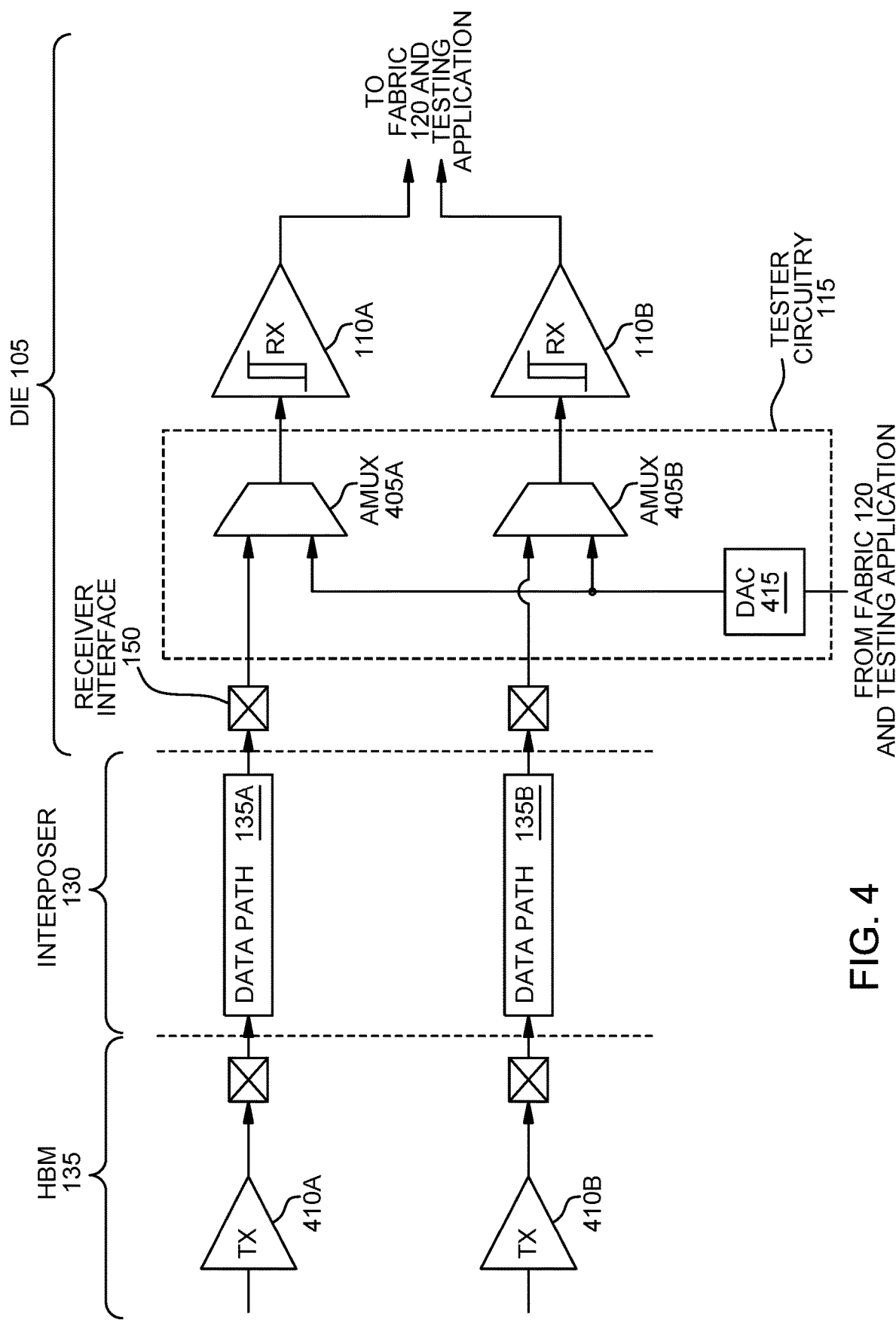
FIG. 4 is a circuit diagram of tester circuitry for testing a die-to-die interface, according to an example.

FIG. 3 is a flowchart of a method 300 for testing a die-to-die interface, according to an example. For clarity, the blocks in the method 300 are discussed in parallel with the circuit diagram in FIG. 4. Specifically, FIG. 4 is a circuit diagram of tester circuitry 115 for testing a die-to-die interface, according to an example. As shown, FIG. 4 illustrates the transmit communication interface between the HBM 135 and the die 105. In this example, the HBM 135 includes multiple transmitters 410A and 410B which are coupled to respective data paths 145 in the interposer 130. In turn, the data paths 145 are coupled to receiver interfaces 150 in the die 105. These interfaces 150 are coupled to respective receivers 110 via the tester circuitry 115. Using the method 300, the tester circuitry 115 can test the receivers 110 to identify their trip points.

At block 305, a DAC 415 in the tester circuitry 115 selects an analog voltage using a digital control signal. In one embodiment, the input of the DAC 415 is coupled to the fabric 120 in the die 105. The fabric 120 can be any communication network in the die 105 that is accessible to a testing application (e.g., a software application executing on a computing device external to the package that includes the die 105). For example, the fabric 120 may permit the testing application to use general I/O elements to transmit the digital control signal to the input of the DAC 415.

The DAC 415 converts the digital control signal into an analog voltage. In one embodiment, each digital control signal may correspond to a unique analog voltage. Thus, by changing the digital control signal, the testing application can change the analog voltage generated by the DAC 415.

At block 310, analog multiplexers (AMUX) 405 select the analog voltage at the input of the receivers 110. As shown in FIG. 4, the AMUXs 405 have two inputs: the receiver interface 150 on which data is received from the HBM 135 and the DAC 415. Using a select signal (not shown), the testing application can instruct the AMUXs 405 to select the output of the DAC 415 to forward to the receivers 110. Put differently, during testing, the AMUXs 405 output the analog voltage generated by the DAC 415, but during normal operation, the AMUXs 405 output the analog voltages received on the receiver interface 150 from the transmitters 410 in the HBM 135.

At block 315, the testing application monitors the output of the receiver 110. In FIG. 4, the outputs of the receivers 110 are coupled to the fabric 120. As mentioned above, the fabric 120 may be coupled to general I/O elements for the package which are accessible to the testing application. Put differently, because the input of the DAC 415 and the output of the receivers 110 are coupled to the fabric 120, this permits an external application or computing system such as the testing application to control the operation of the tester circuitry 115 to test the receivers 110 as well as monitor the output of the receivers 110.

In one embodiment, the testing application monitors the outputs of the receivers 110 to determine when they switch states. As mentioned above, the receivers 110 have respective trip points where the output of the receivers 110 switch states—e.g., from a high value to a low value and vice versa. But these trip points may be unknown when the die is fabricated. As such, the method 300 can be used to identify the trip point or points for each receiver 110.

At block 320, the testing application determines whether the receiver output switches states. For example, in one embodiment, the testing application transmits digital signals to the DAC 415 using the fabric 120 which cause the DAC 415 to sweep the voltage at the inputs of the receivers 110 from a high voltage to a low voltage. Eventually, the outputs of the receivers 110 switch from a high value to a low value to identify the low voltage trip points of the receivers 110. The receivers 110A and 110B can have the same low voltage trip point or different trip points. As mentioned above, the testing application can determine when the receivers 110 switch states by monitoring their outputs using the fabric 120.

The testing application can also transmit digital signals to the DAC 415 which causes the DAC 415 to sweep the voltage at the inputs of the receivers 110 from a low voltage to a high voltage. Eventually, the outputs of the receivers 110 switch from a low value to a high value to identify the high voltage trip points of the receivers 110 which may be the same or different than the low voltage trip points.

At block 325, the testing application records the trip voltages (i.e., trip points) for the receivers 110. That is, when the output of one of the receivers 110 changes states, the testing application records the current voltage being driven at the input of the receiver 110 by the DAC 415. The testing application can continue to change the voltage at the inputs of the receivers 110 until all the receivers 110 being tested have switched states. In this manner, the method 300 can test multiple receivers 110 in parallel and identify the trip points for each of the receivers 110 individually.

Figure 5:
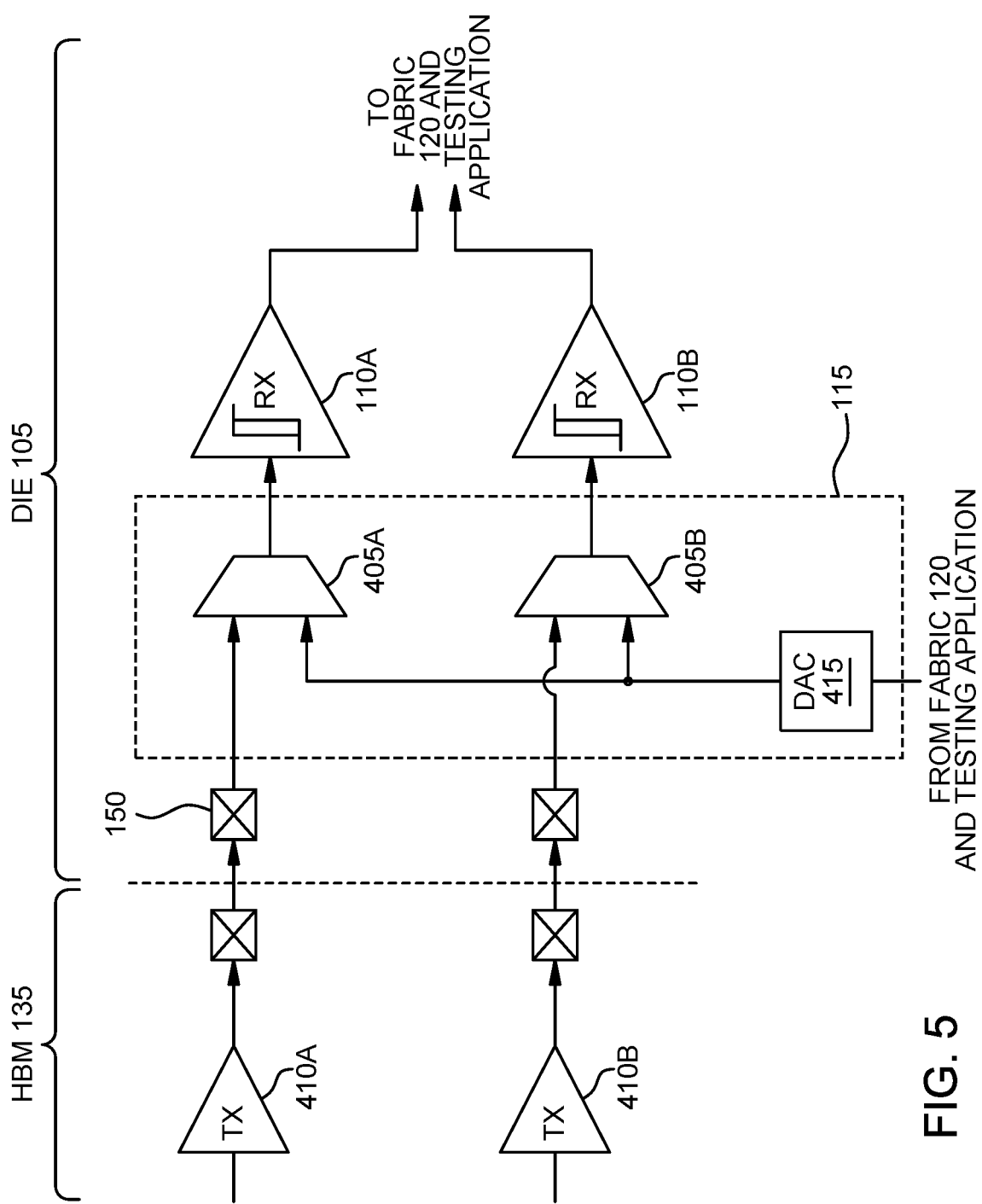
FIG. 5 is a circuit diagram of tester circuitry for testing a die-to-die interface, according to an example.

FIG. 5 is a circuit diagram of tester circuitry 115 for testing a die-to-die interface, according to an example. In one embodiment, the tester circuitry 115 illustrated in FIG. 5 may be used in the 3D stack configuration illustrated in FIG. 2. Put differently, the tester circuitry 115 in FIG. 4 may be used in the 2.5D configuration illustrated in FIG. 1 while the tester circuitry 115 in FIG. 5 is used in a 3D configuration. As such, rather than the die 105 being coupled to the HBM 135 through an interposer, the die 105 is directly coupled to the HBM 135 using I/O elements (e.g., solder bumps of I/O pins).

However, the operation of the tester circuitry 115 may be the same as described above in the method 300. That is, using the fabric 120, a testing application can control the DAC 415 to vary the inputs of the receivers 110 to determine when the outputs of the receivers 110 switch states. The testing application can record these voltages as the trip points of the receivers 110. During normal operation, the selector signals to the AMUXs 405 can be set so that the signals received from the HBM 135 are forwarded to the receivers 110 rather than the output of the DAC 415.

Figure 6:
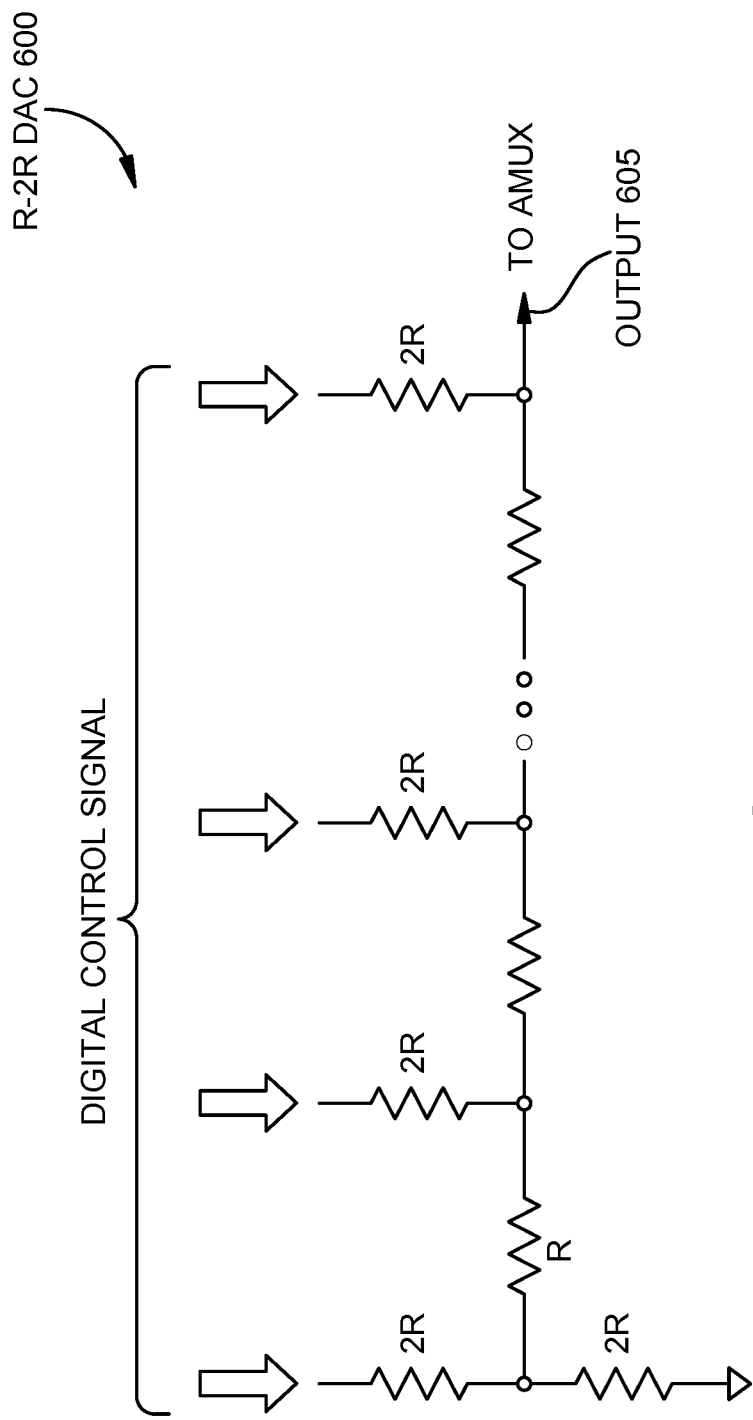
FIG. 6 is a circuit diagram of a digital to analog converter, according to an example.

FIG. 6 is a circuit diagram of a DAC 600, according to an example. Specifically, the DAC 600 is a R-2R DAC 600 which includes multiple 2R vertical legs that are coupled together by resistors R. That is, the vertical legs each include a resistor with a value of 2R while the vertical legs are connected by resistors with a value of R. The actual value of R can vary depending on the desired implementation.

The digital control signal provided by the testing application (via the fabric) is inputted on the vertical legs which control an output 605 of the DAC 600. The analog voltage generated at the output 605 is driven onto the AMUXs, which, as shown in the FIGS. 4 and 5, forward the analog voltage generated by the DAC 600 to the inputs of the receivers 110.

Although an R-2R DAC 600 is illustrated in FIG. 6, the embodiments herein are not limited to such. Put differently, an R-2R DAC 600 is only one example of a DAC suitable for the tester circuitry 115 illustrated in FIGS. 4 and 5.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects described herein may take the form of an entirely hardware embodiment, an entirely software embodiment (including firmware, resident software, micro-code, etc.) or an embodiment combining software and hardware aspects that may all generally be referred to herein as a "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method for testing a first receiver in a semiconductor die, the method comprising:
   selecting an analog voltage using a digital control signal transmitted to a digital to analog converter (DAC) in the semiconductor die;
   transmitting the analog voltage from the DAC to a first multiplexer, wherein the first multiplexer forwards the analog voltage to the first receiver;
   varying the analog voltage outputted by the DAC until an output of the first receiver changes states; and
   recording a trip voltage of the first receiver, wherein the trip voltage corresponds to the analog voltage outputted by the DAC when the first receiver changes states.

2. The method of claim 1, wherein varying the analog voltage outputted by the DAC comprises:
   sweeping the analog voltage until the output of the first receiver changes states.

3. The method of claim 1, wherein the semiconductor die is coupled to a memory die that sends data signals to the semiconductor die, wherein the method further comprises:
   operating the semiconductor die in a normal operation mode during which the first multiplexer forwards the data signals transmitted by the memory die to the first receiver.

4. The method of claim 3, wherein the semiconductor die is coupled to the memory die via an interposer, wherein a first I/O element couples the interposer to the memory die and a second I/O element couples the interposer to the first receiver in the semiconductor die.

5. The method of claim 3, wherein the memory die is a high bandwidth memory (HBM).

6. The method of claim 3, wherein a die-to-die communication interface between the memory die and the semiconductor die is inaccessible to general I/O elements for a package containing the memory die and the semiconductor die.

7. The method of claim 1, wherein the DAC is coupled to a second multiplexer which is in turn coupled to a second receiver, the method further comprising:
   transmitting the analog voltage from the DAC to the second multiplexer, wherein the second multiplexer forwards the analog voltage to the second receiver;
   varying the analog voltage outputted by the DAC until an output of the second receiver changes states; and
   recording a trip voltage of the second receiver, wherein the trip voltage corresponds to the analog voltage outputted by the DAC when the second receiver changes states.

8. The method of claim 7, wherein the trip voltage of the first receiver is different from the trip voltage of the second receiver.

9. A semiconductor die, comprising:
   a first multiplexer, wherein a first input of the first multiplexer is coupled to a receiver interface;
   a DAC connected to a second input of the first multiplexer; and
   a first receiver coupled to an output of the first multiplexer,
   wherein the semiconductor die is configured to determine a trip point of the first receiver by:
      selecting an analog voltage to output using the DAC,
      transmitting the analog voltage from the DAC to the first multiplexer, wherein the first multiplexer forwards the analog voltage to the first receiver, and
      varying the analog voltage outputted by the DAC until an output of the first receiver changes states.

10. The semiconductor die of claim 9, wherein varying the analog voltage outputted by the DAC comprises:
    sweeping the analog voltage until the output of the first receiver changes states.

11. The semiconductor die of claim 9, wherein the receiver interface is configured to couple to a memory die that sends data signals to the semiconductor die via the receiver interface, wherein the semiconductor die is configured to:
    operate in a normal operation mode during which the first multiplexer forwards the data signals transmitted by the memory die to the first receiver.

12. The semiconductor die of claim 11, wherein the memory die is a high bandwidth memory (HBM).

13. The semiconductor die of claim 9, further comprising:
    a second multiplexer, wherein a first input of the second multiplexer is coupled to a second receiver interface and a second input of the second multiplexer is coupled to the DAC; and
    a second receiver, wherein an output of the second multiplexer is coupled to the second receiver,
    wherein the semiconductor die is configured to determine a trip point of the second receiver by:
       transmitting the analog voltage from the DAC to the second multiplexer, wherein the second multiplexer forwards the analog voltage to the second receiver, and
       varying the analog voltage outputted by the DAC until an output of the second receiver changes states.

14. A system, comprising:
    a semiconductor die, comprising:
       a first multiplexer coupled to a receiver interface,
       a DAC connected to the first multiplexer, and
       a first receiver coupled to the first multiplexer; and
    a testing application communicatively coupled to the semiconductor die, wherein the testing application is configured to:
       transmit a digital control signal that controls an analog voltage outputted using the DAC,
       monitor an output of the first receiver to determine when the first receiver changes states, and
       record a trip voltage of the first receiver, wherein the trip voltage corresponds to the analog voltage outputted by the DAC when the first receiver changes states.

15. The system of claim 14, wherein the testing application is configured to:
    transmit a plurality of digital control signals that cause the DAC to sweep the analog voltage until the first receiver changes states.

16. The system of claim 14, further comprising:
    a memory die that sends data signals to the semiconductor die during normal operation, wherein during normal operation mode the first multiplexer forwards the data signals transmitted by the memory die to the first receiver.

17. The system of claim 16, further comprising:
    an interposer coupling the semiconductor die to the memory die, wherein a first I/O element couples the interposer to the memory die and a second I/O element couples the interposer to the first receiver in the semiconductor die.

18. The system of claim 16, wherein the memory die is a high bandwidth memory (HBM).

19. The system of claim 16, wherein a die-to-die communication interface between the memory die and the semiconductor die is inaccessible to general I/O elements for a package containing the memory die and the semiconductor die.

20. The system of claim 14, wherein the DAC is coupled to a second multiplexer which is in turn coupled to a second receiver in the semiconductor die,
  wherein the testing application is configured to:
    monitor an output of the second receiver to determine when the second receiver changes states, and
    record a trip voltage of the second receiver, wherein the trip voltage corresponds to the analog voltage outputted by the DAC when the second receiver changes states.

* * * * *